United States Patent [19]

Marsh et al.

[11] 3,951,658

[45] Apr. 20, 1976

[54] COLOR MODIFYING IMAGING METHOD AND ARTICLE

[75] Inventors: Dana G. Marsh, Rochester; William W. Limburg, Penfield, both of N.Y.

[73] Assignee: Xerox Corporation, Stamford, Conn.

[22] Filed: May 24, 1974

[21] Appl. No.: 473,018

[52] U.S. Cl. .............................. 96/27 R; 427/150; 96/115 R; 250/372
[51] Int. Cl.$^2$ ..................... G03C 5/04; B14M 5/00; G03C 1/68
[58] Field of Search ............... 96/27, 115; 117/36.8, 117/36.9; 427/150; 250/372

[56] References Cited
UNITED STATES PATENTS

| | | | |
|---|---|---|---|
| 2,663,656 | 12/1953 | Miller et al. | 117/36.8 |
| 2,892,712 | 7/1959 | Plambeck | 96/35.1 |
| 3,484,238 | 12/1969 | Fox | 96/29 |
| 3,740,761 | 8/1973 | Fechter | 117/36.9 |

FOREIGN PATENTS OR APPLICATIONS

| | | | |
|---|---|---|---|
| 1,457,810 | 11/1965 | France | 96/27 R |

Primary Examiner—David Klein
Assistant Examiner—Louis Falasco
Attorney, Agent, or Firm—James J. Ralabate; James P. O'Sullivan; John H. Faro

[57] ABSTRACT

A reprographic imaging method based upon a color modifying reaction. In one embodiment of this method a leuco (colorless or weakly colored) form of a material is allowed to selectively react with an appropriate reagent across a divider in response to selective photochemical modification of said divider whereby the leuco form of this material is converted to a highly colored derivative. In a second embodiment of this invention, the reverse occurs; namely a highly colored material is converted to a colorless or weakly colored derivative. A third contemplated embodiment of this invention involves the conversion of a one colored material to another accompanied by a substituted shift in its absorption spectrum. Each of these systems are highly suitable in preparation of transparencies such as microfilm recordings.

13 Claims, No Drawings

COLOR MODIFYING IMAGING METHOD AND ARTICLE

BACKGROUND OF THE INVENTION

1. Field of the Invention

This invention relates to a method of imaging and an article prepared according to said method. More specifically, this invention involves an imaging method based upon (a) the conversion of a colorless or weakly colored (hereinafter referred to as "leuco") material to a highly colored derivative, (b) the conversion of highly colored material to a colorless or weakly colored derivative; or (c) the conversion of one colored material to another accompanied by a substantial shift in its absorption spectra. In this invention, color modification of a material is achieved by selective reaction of said material with an appropriate reagent across a divider which physically separates said material and said reagent.

2. Description of the Prior Art

The use of organic compounds as light sensitive media for photographic processes is well known, and is perhaps best exemplified by the diazo process. this process is based upon the photochemical changes effected in various diazonium salts upon exposure upon the capacity of these salts to form dyes. In general, dyes are formed when diazonium compounds or a diazotized amine couple with phenols or aromatic amines in an alkaline medium. Upon exposure to light, diazonium compounds undergo decomposition and are rendered incapable of coupling and thus dye formation. This type of reaction is commonly employed in copying papers. For example, in one such process a diazo-anhydride and a coupler are dispersed in a neutral medium, exposed to light of the appropriate wavelength and developed by contacting with ammonia fumes. In another process, paper coated with the diazo compound is developed by immersion in alkaline solution containing the coupler. In yet another system, the developing fluid (gaseous or liquid) and/or one or more of the color forming materials is isolated from the other essential components of the color forming process by microencapsulation. These capsules are pressure sensitive, and can be subsequently ruptured at the appropriate time during the image forming sequence and thus release the materials isolated therein which are necessary for image formation, U.S. Pat. No. 3,111,407.

The photodegradation products of diazonium compounds have also been employed as reducing agents in the conversion of the leuco form of phthalocyanine to a highly colored product, U.S. Pat. No. 2,884,326. In this system, the leuco form of phthalocyanine and the diazonium compound are dispersed in a water permeable colloid and the resulting dispersion coated on a supportive substrate. Upon drying of this dispersion, it is exposed to actiniic radiation and thereafter treated with a solvent capable of dissolving the leuco form of phthalocyanine or with a solution of a strong acid whereby a positive image, in the form of the colored phthalocyanine pigment, is produced in the coating.

In each of the systems described above, image formation is based upon the selective decomposition of a diazonium compound either to render it incapable of coupling with other materials or to assist in conversion of a colorless compound to a highly colored product.

Photodegradation has also been found useful in the preparation of relief images from photodegradable polymers, see for example, U.S. Pat. Nos. 3,558,311; and 2,892,712 (Examples VII and IX). In such processes, the selective illumination of an imaging layer containing such polymers results in degradation of the photodegradable polymer into lower molecular weight materials. The products of such degradation differ from the nondegraded polymer and therefore provide a basis for image formation. In the '311 patent the selective illumination of a polymer containing an oxime ester results in selective degradation of the polymer in the exposed regions of a film containing said polymer. The image is "developed" by removal of the degraded materials from the imaging layer by solvents which are specific for the degradation products, but unreactive toward the unexposed regions of the imaging layer. The '711 patent is similar in its disclosure, however, subsequent to imaging of the film of an unstabilized formaldehyde polymer, the image is "developed thermally". In both these patented imaging systems, the intensity and duration of exposure required to produce photolytic degradation within such films is quite extensive. Moreover, even after such extensive exposure, the image is still not visible, but requires development either with solvents or by thermal treatment. These systems are, thus, inefficient, expensive and generally impractical for use commercially.

Accordingly, it is the object of this invention to provide an imaging method wherein image formation involves the interaction of a highly colored, weakly colored or colorless material and at least one other reagent across a divider separating said material and said reactant(s).

More specifically, it is the principal object of this invention to selectively shift the absorption spectra of a highly colored, weakly colored or colorless material by interaction of said materials with one or more reactants across a divider in response to image information.

Another object of this invention is to provide a method for the selective modification of this divider so as to permit the desired interaction between the separated materials.

It is yet another object of this invention to provide a method for selective modification of the permeability of the divider to one or more of the separated materials by exposure of said divider to ultraviolet light.

Additional objects of this invention include the preparation of stable positive or negative images by the above method.

SUMMARY OF THE INVENTION

The above and related objects are achieved by providing a method for shifting the absorption spectrum of an intensely colored, weakly colored or colorless materials by selective interaction of said materials with at least one reactant across a polymeric divider in response to a stimulus capable of increasing the permeability of said divider to such materials and/or reactants. This polymeric divider can be selectively modified in response to an appropriate stimulus, such as ultraviolet light, thereby creating regions of reduced viscosity across this layer whereby diffusion of at least some of the separated materials occur into and across this layer. In a preferred embodiment of this invention, the polymeric divider comprises a stable polymeric matrix containing finely dispersed domains of photodegradable polymer.

DESCRIPTION OF THE INVENTION INCLUDING PREFERRED EMBODIMENTS

The imaging system of this invention is based upon the reaction or interaction of known color modifying materials. Prior to imaging, the reaction or interaction of the above materials is precluded by the interposition therebetween of a polymeric divider (e.g. layer or microcapsule). During imaging this polymeric divider is selectively modified so as to allow for the diffusion into and across this divider of one or more of the above materials and thus formation of an image of moderate to high color contrast.

In a representative embodiment of this invention, the leuco compound can be an oxidized form of metal-free or metal-containing phthalocyanine. Such leuco compounds can be readily prepared by treatment of metal-free or metal-containing phthalocyanine with dibenzylperoxide, Pederson, J. Org. Chem. 22, 127 (1957). Oxidized phthalocyanines can be regenerated to their highly colored derivatives by contacting them, under the appropriate conditions, with organic reducing acids (e.g. ascorbic acid or atrolactic acid); metal hydrides (e.g. sodium borohydride); inorganic reducing agents (e.g. sodium dithionite, sodium hydrosulfite, sodium sulfide); redox reducing agents — electron donors (e.g. ferrous sulfate); or metals (e.g. alkali metal, alkaline earth metals or zinc).

In yet another embodiment of this invention, the leuco compounds can be selected from among the colorless form of certain triphenylmethane dyes (e.g. 4,4'4'-methylidyne-tris(N, N-dimethylaniline) or p,p'-benzylidine-bis-(N, N-dimethylaniline)); hydroxyanthraquinones (e.g. leucoquinizarin); indigoid dyes (e.g. indigoid white — C. I. Reduced Vat. Bluel); thioindigoid dyes (e.g. thioindigoid Red B — C. I. Vat Red 41). These leuco compounds can be converted to highly colored products by oxidation with the appropriate agents. Typical of such oxidizing agents which are known to effectively oxidize one or more of the above leuco compounds include p-quinoid compounds (e.g. bromanil, chloranil, or dicyano-dischloro-p-benzoquinone); electron deficient acid anhydrides (e.g. maleic anhydride); vinyl containing electron deficient species (e.g. fumaronitriled); hydroperoxides (e.g. cumyl hydroperoxide); or peroxy compounds (e.g. dibenzoylperoxide or peroxydicarbonates).

In a third possible embodiment of this invention, certain other compounds can be oxidized to highly colored products by means other than electron transfer reactions. Typical of compounds which are suitable in this regard include N, N-disubstituted anilines, (e.g. N, N-dimethylaniline) or conjugated anilines (e.g. tetramethylbenzidine). These materials can be transformed to highly colored products by reaction with peroxycarbonates (e.g. di(1,3-dimethyl-3-[t-butylperoxy]butyl)-peroxydicarbonate).

The polymeric divider of separator useful in this invention comprises a composition capable of maintaining physical separation between the leuco or intensely colored compounds and the color modifying reagents (thus preventing their uncontrolled interaction), and is yet capable of selective modification in response to an appropriate stimulus whereby the separated materials are allowed to interact in those areas corresponding to the modified portions of the divider. Materials which are suitable in the formation of this divider include dispersions and/or solid solutions of photodegradable polymers in relatively stable polymer matrices. Upon the selective degradation of these photodegradable polymers, the relatively stable matrix will undergo a selective reduction in its viscosity and thus become permeable to one or more of the separated materials. These partially degraded areas of the divider are incapable of preventing interaction of the leuco compounds or intensely colored compounds with the color modifying reagents and thus such compounds will interact with such reagents and undergo a substantial shift in their respective absorption spectra. Good results are obtained wherein the polymeric divider consists essentially of a halogenated polyolefin and poly(acetaldehyde) or homologue thereof. This divider can also contain additional materials which accelerate or assist in the degradation of poly(acetaldehyde) (e.g. optical sensitizers, UV absorbers etc).

In the imaging systems of this invention, both the leuco compounds and the color modifying reagents can be dispersed and/or dissolved in separate polymeric matrices. These dispersion and/or solutions can be formed separately into self-supporting films and then laminated to one another, provided a polymeric divider layer is interposed therebetween to prevent their interaction (in the absence of an activating stimulus). Laminates such as that described above can also be formed by the coating of such polymeric dispersions in sequence on a supportive substrate. Alternatively, these leuco or intensely color compounds can be separated from such color modifying reagents by microencapsulating of either in polymeric materials of the type used in formation of the above divider layer. These microcapsules can then be co-dispersed with the complimentary component of the color modifying reaction in an appropriate matrix.

In the formation of the structures and/or compositions useful in the imaging process of this invention, care must be exercised with regard to the sequence in which the various components of such structures and compositions are combined. The area of principal concern involves the proper selection of solvent systems so as to avoid the premature breakdown of the polymeric divider and the uncontrolled interaction of the leuco or intensely colored compounds with the color modifying reagents.

After the various components of the color modifying reaction and polymeric divider have been formed into an appropriate structure or composition, it can be selectively exposed to an activating stimulus whereby the divider separating the componenents of the color modifying reaction is itself modified so as to permit their interaction. For example, exposure of a polymeric divider comprising a dispersion of discrete domain of poly(acetaldehyde) in a halogenated polyolefin matrix to ultraviolet light will result in a relaxation of its separating properties and thus interaction of the leuco or intensely colored compounds and the color modifying reagents. It is both critical and essential that the activating stimulus which causes selective modification of the polymeric divider not bring about any corresponding degradation with regard to either the leuco compounds, the intensely colored compounds, or the color promoting reagents also subjected to such stimulus.

The Examples which follow further define, describe and illustrate the imaging method of this invention. Techniques and apparatus used in preparation of the structures/ compositions useful in the above method are standard or as hereinbefore described. Parts and percentages appearing in such Examples are by weight unless otherwise indicated.

EXAMPLE I

An imaging member useful in the imaging process of this invention is prepared by draw coating, in sequence, three separate films on a Mylar substrate. The coating recipes for each film are as follows:

Coating recipe for leuco compound:
- 10 parts poly(vinylformal) — $\overline{M}_w$~90,000 — (Polysciences, Inc.)
- 1 part oxidized metal-free phthalocyanine
- 90 parts tetrahydrofuran Coating recipe for polymeric divider:
- 10 parts poly(vinylchloride) — $\overline{M}_w$~120,000 — (Union Carbide)
- 1.5 parts poly(acetaldehyde) — $\overline{M}_w$~85,000
- 1 part benzophenone
- 90 parts tetrahydrofuran Coating recipe for color modifying reagents:
- 10 parts poly(vinylalcohol) — "Elvonol" — (Grade 51-03) — available from E. I. du Pont Nemours Inc., Wilmington, Delaware
- 10 parts ascorbic acid
- 80 parts water/ethanol (absolute), 50:50

The leuco compound solution is draw-bar coated on the Mylar substrate using a Gardner mechanical drive apparatus equipped with a doctor blade having a wet gap setting of 0.008 inches. Upon evaporation of solvent residues, the dry film thickness of this layer is estimated at 25 microns. This coating is slightly yellow and apparently free from crystallization. A polymeric divider layer is now superimposed on this first layer in substantially the same manner as described above, allowed to dry, and a layer containing the color modifying reagent formed on top of the divider layer. After this composite is substantially free of solvent residues used in its preparation, it is exposed through a silver halide emulsion negative with a 100 watt high pressure mercury arc lamp (available from P. E. K. Inc., Sunnydale, California) for a period of from 15 to 120 seconds from a distance of 25 centimeters. The color reaction proceeds fairly rapidly after initial divider layer relaxation; color intensity of the image increasing with time. Image resolution is excellent. The exposed composite film can be stored or mounted in a plastic transparency holder and thereafter projected.

EXAMPLE II

The procedures of Example I are repeated, except for reversal in the order of the coating of the leuco compound layer and the color modifying reagent layer. The composite film prepared in this manner is less stable than that prepared in Example I. Apparently, since the solvent systems used in coating the color modifying reagent layer is also a solvent for the materials of the divider layer, some impairment in the effectiveness of the divider layer occurs, thus, allowing for premature interaction of ascorbic acid and oxidized metal-free phthalocyanine. Such interaction does not necessarily occur spontaneously, however, the dark stability of this film is markely inferior to the films prepared in Example I.

EXAMPLE III

The procedures of Example I are repeated except for modification of the divider layer by increasing the concentration of both poly(acetaldehyde) and benzophenone by a factor of 5. The dark stability of the composiite is better than Example II but somewhat less than Example I.

EXAMPLE IV

The procedures of Example I are repeated, except for the following changes in the leuco compound and color modifying reagent coating recipes.

Coating recipe for leuco compound:
- 10 parts poly(vinylalcohol) — "Elvanol" (Grade 51-03) — available from E. I. du Pont de Nemours and Company, Wilmington, Delaware
- 0.1 parts 2,3-di-chloro-5,6-dicyanobenzoquinone
- 90 parts water/ethanol (absolute), 50:50

Coating recipe for polymeric divider:
Same as Example I

Coating recipe for color modifying reagent:
- 10 parts poly(vinylformal) — $\overline{M}_w$ 90,000 (polysciences, Inc.)
- 0.05 parts 4,4'4,4'-methylidyne-tris-(N, N-dimethylaniline)
- 0.05 parts p,p'-benzilidine-bis-(N,N-dimethylaniline)
- 90 parts tetrahydrofuran The order of coating the above recipes on a Mylar substrate is the reverse of that described in Example I; namely, the color modifying reagents are coated first followed by the divider layer and then the leuco compound. This sequence of coating insures minimum impairment of the integrity of the divider layer, since the solvent used in coating the leuco compound is a non-solvent for the divider layer. Image information is projected onto the resultant film in the same manner described in Example I. Resolution of the image is excellent. Dark stability of the above film is also highly satisfactory. Reversal of the order of coating of the leuco compound and the color modifying reagents yield substantially the same result as that experienced in Example II.

EXAMPLE V – IX

The procedures of Example I and IV are repeated except for the substitution of the following materials for poly(acetaldehyde).

| EXAMPLE NO. | PHOTODEGRADABLE POLYMER |
| --- | --- |
| V | poly(propionaldehyde) |
| VI | poly(butyraldehyde) |
| VII | poly(valeraldehyde) |
| VIII | poly(hexaldehyde) |
| IX | poly(chloroacetaldehyde) |
| X | poly(fluoroacetaldehyde) |
| XI | poly(cyanoacetaldehyde) |

Results are comparable to those achieved in Example I and IV.

The following series of Examples illustrate specific embodiments of this invention wherein a colored material is converted to a more intensely colored material or a material of a different color by selective interaction with a color modifying reagent across a polymeric divider layer.

EXAMPLE XI

The procedures of Example I are repeated, except for the substitution of the following combination of coating recipes for those specified in Example I.

Coating recipe for colored compound:

10 parts poly(vinyl alcohol) — "Elvanol" — (Grade 51-03) — available from E. I. du Pont de Nemours Inc., Wilmington, Delaware
0.1 parts Rosolic Acid (C. I. 4 — 3800) — yellow dye — available from J. T. Baker, Philipsburg, N. J.
90 parts water/ethanol (absolute), 50:50

Coating recipe for polymeric divider:
10 parts poly(vinylchloride) — $\overline{M}_w$ 120,000 (Union Carbide)
1.5 parts poly(acetaldehyde) — $\overline{M}_w$ 85,000
1 part benzophenone
90 parts tetrahydrofuran Coating recipe for color modifying reagent:
10 parts poly(vinylpyridine)
90 parts diethylamine The above recipes are coated in sequence (in the order of their listing) on a 5 mil thick sheet of Mylar (polyethylene terephthalate — available from E. I. de Pont de Nemours Inc., Wilmington, Delaware). The resulting composite is imaged in the manner described in Example I, resulting in the intensification in color of the yellow film in the exposed areas as a result of the selective interaction of the Rosolic acid with the diethylamine and the poly(vinyl pyridine). The resulting composite has good dark stability. The respective solvent systems for the coating recipes of the colored compound and the color modifyiing reagent enable reversal of the order of coating of these layers without premature degradation of the polymeriic divider. The order of coating of the color layer can be of significance where the energy source required to alter the permeability of the divider layer is also absorbed by the yellow dye. Where benzophenone is used to sensitize the degradation of poly(acetaldyhde), not much interference is, however, encountered.

EXAMPLE XII – XIV

The procedure of Example XI are repeated except for the substitution of the following coating recipes for the colored compound.

EXAMPLE XII 0.1 part Neutral Red (C. I. 50040)
10 parts poly(vinylalcohol)
90 parts water/ethanol (Absolute) 50:50

The resulting composite film exhibits good dark stability. Upon selective partial degradation of the divider layer in the manner set forth in Example I, the Neutral Red and one or more of the materials within the layer containing the color modifying reagents interact, thus, forming a high resolution color contrast image.

EXAMPLE XIII 0.1 part Cresol Red
10 parts poly(vinylalcohol)
90 parts water/ethanol (Absolute) 50:50

The resulting composite film exhibits good dark stability. Upon selective partial degradation of the divider layer in the manner described in Example I, the Cresol Red and one or more of the materials within the layer containing the color modifying reagents interact, thus, forming a high resolution color contrast image.

EXAMPLE XIV 0.1 part Bromthyol Blue
10 parts poly (vinylalcohol)
90 parts water/alcohol (Absolute) 50:50

The resulting composite film exhibits good dark stability. Upon selective partial degradation of the divider layer in the manner described in Example I, the Bromthyol Blue and one or more of the materials within the layer containing the color modifying reagents interact, thus, forming a high resolution color contrast image.

What is claimed is:

1. In an imaging system based upon the selective interaction of leuco or highly colored compounds with one or more color modifying reagents thus leading to the formation of a product differing in absorption spectrum from any of the materials undergoing said interaction, the improvement consisting essentially of:
    a. providing a structure or composition wherein said leuco or highly colored compounds are separated from color modifying reagents by a polymeric divider layer thus precluding their uncontrolled interaction and formation of a product having an absorption spectrum different from the materials separated by said divider, said polymeric divider layer being capable of undergoing selective reduction in viscosity in response to ultraviolet light; and
    b. selectively exposing said structure or composition to ultraviolet light, whereby the viscosity in the exposed areas of the polymeric divider layer is reduced, thereby, allowing for the selective interaction of the leuco or highly colored compounds with the color modifying reagents and the formation of a product having an absorption spectrum different from any of the interacting materials.

2. The imaging method of claim 1, wherein the polymeric divider layer comprises discrete domains of a degradable polymer in a relatively stable matrix.

3. The imaging method of claim 1, wherein the polymeric divider layer comprises discrete domains of an acid degradable polymer in a matrix capable of generating acid in response to ultraviolet light.

4. The imaging method of claim 1, wherein the polymeric divider comprises:
    a. discrete domains of degradable polymer of the formula

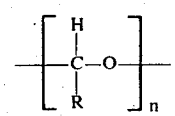

wherein
    R is selected from among hydrogen, an alkyl radical of 1 – 6 carbon atoms, a chlorine or fluorine substituted alkyl radical of 1 – 6 carbon atoms, or a cyanosubstituted aliphatic hydrocarbon radical of 1 – 5 carbon atoms; and
    n is in excess of about 25;
    b. a photoactive agent which upon exposure to ultraviolet light of the appropriate wavelength is capable of abstracting a hydrogen atom from the backbone of said degradable polymer; and
    c. a halogenated polymer.

5. The imaging method of claim 1, wherein the leuco compounds are selected from among the oxidized forms of metal-free and metal-containing phthalocyanines.

6. The imaging method of claim 1, wherein the leuco compound is selected from among the leuco forms of triphenylmethane dyes.

7. The imaging method of claim 1, wherein the leuco compound is selected from among N,N-di-substituted anilines or conjugated anilines.

8. In an imaging system based upon the selective interaction of leuco or highly colored compounds with one or more color modifying reagents thus leading to the formation of a product differing in absorption spectrum from any of the materials undergoing said interaction, the improvement consisting essentially of:
   a. providing a structure or composition wherein said leuco or highly colored compounds are separated from color modifying reagents by a polymeric divider layer thus precluding their uncontrolled interaction and formation of a product having an absorption spectrum different from the materials separated by said divider, said polymeric divider layer being capable of undergoing selective reduction in viscosity in response to ultraviolet light and comprising
   i. discrete domains of degradable polymer of the formula

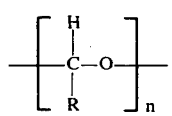

wherein
   R is selected from among hydrogen, an alkyl radical of 1 – 6 carbon atoms, a chlorine or fluorine substituted alkyl radical of 1 – 6 carbon atoms, or a cyanosubstituted aliphatic hydrocarbon radical of 1 – 5 carbon atoms; and
   $n$ is in excess of about 25;
   ii. a photoactive agent which upon exposure to electromagnetic radiation of the appropriate wavelength is capable of abstracting a hydrogen atom from the backbone of said degradable polymer; and
   iii. a halogenated polymer; and
   b. selectively exposing said structure or composition to ultraviolet light, whereby the viscosity in the exposed areas of the polymeric divider layer is reduced, thereby, allowing for the selective interaction of the leuco or highly colored compounds with the color modifying reagents and formation of a product having a absorption spectrum different from any of the interacting materials.

9. the imaging method of claim 8, wherein the polymeric divider layer comprises discrete domains of a degradable polymer in a relatively stable matrix.

10. The imaging method of claim 8, wherein the polymeric divider layer comprises discrete domains of an acid degradable polymer in a matrix capable of generating acid in response to ultraviolet light.

11. The imaging method of claim 8, wherein the leuco compounds are selected from among the oxidized forms of metal-free and metal-containing phthalocyanines.

12. The imaging method of claim 8, wherein the leuco compound is selected from among the leuco forms of triphenylmethane dyes.

13. The imaging method of claim 8, wherein the leuco compound is selected from among N,N-di-substituted anilines of conjugated anilines.

* * * * *

UNITED STATES PATENT AND TRADEMARK OFFICE
CERTIFICATE OF CORRECTION

PATENT NO. : 3,951,658
DATED : April 20, 1976
INVENTOR(S) : Dana G. Marsh and William W. Limburg It is certified that error appears in the above-identified patent and that said Letters Patent are hereby corrected as shown below:

Column 1, line 24, delete "this" and insert --This--.

Column 1, line 26, after the word "exposure", insert --to light and the effect of such exposure--.

Column 1, line 57, delete "actiniic" and insert --actinic--.

Column 4, line 50, delete "componenents" and insert --components--.

Column 5, line 21, delete "Elvonol" and insert --Elvanol--.

Column 5, line 62, delete "markely" and insert --markedly--.

Column 6, line 2, delete "iite" and insert --ite--.

Column 6, line 18, delete "(poly-" and insert --(Poly- --.

Column 7, line 28, delete "modifyiing" and insert --modifying--.

Column 7, line 30, delete "polymeriic" and insert --polymeric--.

Column 10, line 18, delete "the" and insert --The--.

Column 10, line 33, delete "of" and insert --or--.

Signed and Sealed this

Thirteenth Day of July 1976

[SEAL]

Attest:

RUTH C. MASON
Attesting Officer

C. MARSHALL DANN
Commissioner of Patents and Trademarks